United States Patent
Friedrich et al.

(10) Patent No.: US 10,386,427 B1
(45) Date of Patent: Aug. 20, 2019

(54) MAGNETIC FIELD SENSOR HAVING AT LEAST TWO CVH ELEMENTS AND METHOD OF OPERATING SAME

(71) Applicant: Allegro MicroSystems, LLC, Manchester, NH (US)

(72) Inventors: Andreas P. Friedrich, Metz-Tessy (FR); Andrea Foletto, Annecy (FR); Nicolas Yoakim, Morges (CH)

(73) Assignee: Allegro MicroSystems, LLC, Manchester, NH (US)

( * ) Notice: Subject to any disclaimer, the term of this patent is extended or adjusted under 35 U.S.C. 154(b) by 7 days.

(21) Appl. No.: 15/892,843

(22) Filed: Feb. 9, 2018

(51) Int. Cl.
*G01B 7/30* (2006.01)
*G01R 33/07* (2006.01)
*G01R 33/00* (2006.01)

(52) U.S. Cl.
CPC ....... *G01R 33/077* (2013.01); *G01R 33/0005* (2013.01); *G01R 33/0094* (2013.01)

(58) Field of Classification Search
CPC ................................. G01R 33/0023–0041; G01R 33/02–10; G01P 3/42–4956; G01D 5/12–2525
See application file for complete search history.

(56) References Cited

U.S. PATENT DOCUMENTS

| | | | |
|---|---|---|---|
| 7,235,968 B2 | 6/2007 | Popovic et al. | |
| 7,852,070 B2 * | 12/2010 | Yamada | G01D 5/145 324/207.21 |
| 8,729,890 B2 | 5/2014 | Donovan et al. | |
| 9,329,057 B2 | 5/2016 | Foletto et al. | |

(Continued)

FOREIGN PATENT DOCUMENTS

| | | |
|---|---|---|
| EP | 2000813 A1 | 12/2008 |
| WO | WO 2008/145662 A1 | 12/2008 |

OTHER PUBLICATIONS

Allegro MicroSystems, LLC; Datasheet A1330 "Programmable Angle Sensor IC with Analog and PWM Output" dated Sep. 25, 2017; 38 pages.

(Continued)

*Primary Examiner* — Tung X Nguyen
*Assistant Examiner* — David B Frederiksen
(74) *Attorney, Agent, or Firm* — Daly, Crowley, Mofford & Durkee, LLP

(57) ABSTRACT

A magnetic field sensor for sensing a direction of a magnetic field in an x-y plane, can include a first plurality of magnetic field sensing elements operable to generate a first plurality of magnetic field signals and a second plurality of magnetic field sensing elements operable to generate a second plurality of magnetic field signals. The magnetic field sensor can also include at least one sequence switches circuit operable to select ones of the first plurality of magnetic field signals and to select ones of the second plurality of magnetic field signals. The magnetic field sensor can also include a processing circuit operable to combine the selected ones of the first plurality of magnetic field signals and the selected ones of the second plurality of magnetic field signals to generate at least one sequential signal and to process the at least one sequential signal to generate an x-y angle signal indicative of a direction of the magnetic field in the x-y direction. An associated method is described.

28 Claims, 9 Drawing Sheets

(56) References Cited

U.S. PATENT DOCUMENTS

| | | | | |
|---|---|---|---|---|
| 2003/0042894 A1* | 3/2003 | Waffenschmidt | ........ | G01B 7/30 |
| | | | | 324/207.21 |
| 2005/0278137 A1* | 12/2005 | Hammerschmidt | ... | G01B 21/22 |
| | | | | 702/151 |
| 2009/0174395 A1* | 7/2009 | Thomas | ................. | G01D 5/145 |
| | | | | 324/207.2 |
| 2010/0327857 A1* | 12/2010 | Hoshiya | ................. | B82Y 25/00 |
| | | | | 324/207.25 |
| 2012/0095712 A1* | 4/2012 | Komasaki | .............. | G01D 3/036 |
| | | | | 702/94 |

OTHER PUBLICATIONS

P. M. Drijaca et al., "Nonlinear Effects in Magnetic Angular Position Sensor With Integrated Flux Concentrator", PROC, 23$^{rd}$ International Conference on Microelectronics (MIEL 2002), vol. 1, NIŠ, Yugoslavia, May 12-15, 2002; 4 pages.

\* cited by examiner

MAGNETIC FIELD SENSOR HAVING AT LEAST TWO CVH ELEMENTS AND METHOD OF OPERATING SAME

CROSS REFERENCE TO RELATED APPLICATIONS

Not Applicable.

STATEMENT REGARDING FEDERALLY SPONSORED RESEARCH

Not Applicable

FIELD OF THE INVENTION

This invention relates generally to magnetic field sensors and, more particularly, to a magnetic field sensor that has at least two CVH elements (or at least two pluralities of magnetic field sensing elements) operating in concert.

BACKGROUND

Magnetic field sensors can be used in a variety of applications. In one application, a magnetic field sensor can be used to detect a direction of a magnetic field, i.e., and angle of the direction of the magnetic field. In another application, a magnetic field sensor can be used to sense an electrical current. One type of current sensor uses a Hall Effect magnetic field sensing element in proximity to a current-carrying conductor.

Planar Hall elements and vertical Hall elements are known types of magnetic field sensing elements used in magnetic field sensors. A planar Hall element tends to be responsive to magnetic field perpendicular to a surface of a substrate on which the planar Hall element is formed. A vertical Hall element tends to be responsive to magnetic field parallel to a surface of a substrate on which the vertical Hall element is formed.

Other types of magnetic field sensing elements are known. For example, a so-called "circular vertical Hall" (CVH) sensing element, which includes a plurality of vertical Hall elements, is known and described in PCT Patent Application No. PCT/EP2008056517, entitled "Magnetic Field Sensor for Measuring Direction of a Magnetic Field in a Plane," filed May 28, 2008, and published in the English language as PCT Publication No. WO 2008/145662, which application and publication thereof are incorporated by reference herein in their entirety. The CVH element is a circular arrangement of a plurality of vertical Hall elements arranged over a common circular implant region in a substrate, and without barriers to flow of electrical current among the vertical Hall elements. The CVH element can be used to sense a direction (i.e., an angle) (and optionally, an amplitude) of a magnetic field in a plane of the substrate.

Various parameters characterize the performance of magnetic field sensing elements and magnetic field sensors that use magnetic field sensing elements. These parameters include sensitivity, which is a change in an output signal of a magnetic field sensing element in response to a change of magnetic field experienced by the magnetic sensing element, and linearity, which is a degree to which the output signal of the magnetic field sensing element varies in direct proportion to the magnetic field. These parameters also include an offset, which is characterized by an output signal from the magnetic field sensing element not representative of a zero magnetic field when the magnetic field sensing element experiences a zero magnetic field.

The above-described CVH element is operable, with associated circuits, to provide an output signal representative of an angle of a direction of a magnetic field. Therefore, as described below, if a magnet is disposed upon or otherwise coupled to a so-called "target object," for example, a camshaft in an engine, the CVH element can be used to provide an output signal representative of an angle of rotation of the target object.

The CVH element provides output signals from a plurality of vertical Hall elements from which it is constructed. Each vertical Hall element can have an undesirable and different DC offset.

The CVH element is but one sensing element that can provide an output signal representative of an angle of a magnetic field, i.e., an angle sensor. For example, an angle sensor can be provided from a plurality of separate vertical Hall elements or a plurality of magnetoresistance elements.

A CVH element has an operation limit at which it can sample vertical Hall elements in the CVH element to identify a direction of the magnetic field. The limit is related to how fast electronic circuits coupled to the CVH element, i.e., how fast a CVH magnetic field sensor that has a CVH element, can take sequential samples around the ring of vertical Hall elements, e.g., thirty-two or sixty-four vertical Hall elements. This limit is of particular interest when the magnetic field is rotating. In order to accurately identify a direction of a rotating magnetic field, a rate at which the CVH magnetic field sensor sequentially samples all the vertical Hall elements of the CVH element must be much higher than the rate of rotation of the magnetic field. It would be desirable to provide a magnetic field sensor forming an angle sensor that can operate at higher sampling rates and that can sense a more rapidly rotating magnetic field.

In addition, using, for example, sixty-four vertical Hall elements in a CVH element and a non-rotating magnetic field, a basic angular resolution is about 5.6 degrees (three hundred sixty divided by sixty-four). It would be desirable to provide a magnetic field sensor forming an angle sensor with a higher resolution (i.e., a smaller basic angle of resolution.)

SUMMARY

The present invention can provide a magnetic field sensor forming an angle sensor that can operate at higher sampling rates and that can sense a more rapidly rotating magnetic field.

The present invention can also provide a magnetic field sensor forming an angle sensor with a higher resolution (i.e., a smaller basic angle of resolution.)

In accordance with an example useful for understanding an aspect of the present invention, a magnetic field sensor for sensing a direction of a magnetic field in an x-y plane, can include a first plurality of magnetic field sensing elements operable to generate a first plurality of magnetic field signals, the first plurality of magnetic field sensing elements having a respective first plurality of maximum response axes aligned in a respective first plurality of different directions in the x-y plane. The magnetic field sensor can also include a second plurality of magnetic field sensing elements operable to generate a second plurality of magnetic field signals different than the first plurality of magnetic field signals, the second plurality of magnetic field sensing elements having a respective second plurality of maximum response axes aligned in a respective second plurality of directions in the x-y plane, wherein the first plurality of directions and the second plurality of directions comprise the same plurality of directions or different pluralities of directions. The magnetic field sensor can also include at least one sequence switches circuit operable to select ones of the first plurality of magnetic field signals and to select ones of the second plurality of magnetic field signals. The magnetic field sensor can also include a processing circuit operable to combine the selected ones of the first plurality of magnetic field signals and the selected ones of the second plurality of magnetic field signals to generate at least one sequential signal and to process the at least one sequential signal to generate an x-y angle signal indicative of a direction of the magnetic field in the x-y direction.

In accordance with another example useful for understanding another aspect of the present invention, a method of sensing a direction of a magnetic field in an x-y plane comprises generating a first plurality of magnetic field signals with a first plurality of magnetic field sensing elements, the first plurality of magnetic field sensing elements having a respective first plurality of maximum response axes aligned in a respective first plurality of different directions in the x-y plane. The method can also include generating a second plurality of magnetic field signals different than the first plurality of magnetic field signals with a second plurality of magnetic field sensing elements, the second plurality of magnetic field sensing elements having a respective second plurality of maximum response axes aligned in a respective second plurality of directions in the x-y plane, wherein the first plurality of directions and the second plurality of directions comprise the same plurality of directions or different pluralities of directions. The method can also include selecting ones of the first plurality of magnetic field signals and selecting ones of the second plurality of magnetic field signals. The method can also include processing the selected ones of the first plurality of magnetic field signals and the selected ones of the second plurality of magnetic field signals to generate at least one sequential signal. The method can also include processing the at least one sequential signal to generate an x-y angle signal indicative of a direction of the magnetic field in the x-y direction.

BRIEF DESCRIPTION OF THE DRAWINGS

The foregoing features of the invention, as well as the invention itself may be more fully understood from the following detailed description of the drawings, in which.

DETAILED DESCRIPTION

Figure 1:
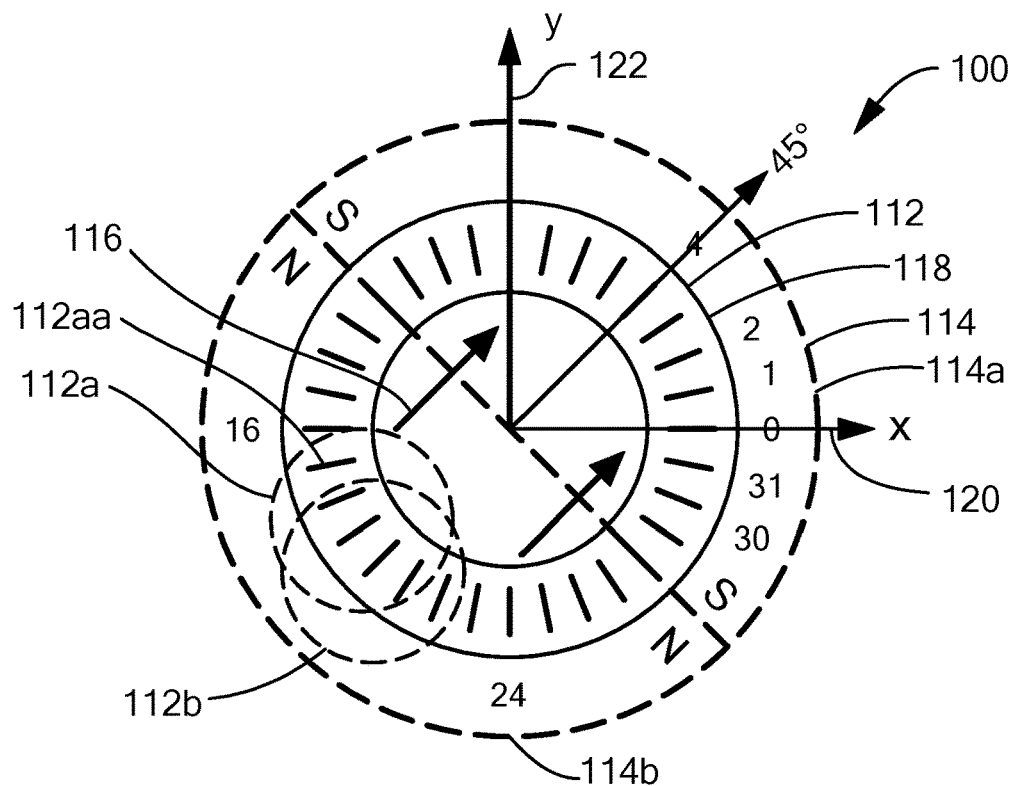
FIG. 1 is a pictorial showing a circular vertical Hall (CVH) sensing element having a plurality of vertical Hall elements arranged in a circle over a common circular implant region upon a substrate, and a two pole magnet disposed close to the CVH element.

The features and other details of the concepts, systems, and techniques sought to be protected herein are more particularly described below. It should be understood that any specific embodiments described herein are shown by way of illustration and not as limitations. The principal features described herein can be employed in various embodiments without departing from the scope of the concepts sought to be protected. Embodiments described herein and associated advantages may be best understood by referring to the drawings, where like numerals are used for like and corresponding parts throughout the various views.

As used herein, the term "magnetic field sensing element" is used to describe a variety of electronic elements that can sense a magnetic field. The magnetic field sensing element can be, but is not limited to, a Hall effect element, a magnetoresistance element, or a magnetotransistor. As is known, there are different types of Hall effect elements, for example, a planar Hall element, a vertical Hall element, and a Circular Vertical Hall (CVH) element. As is also known, there are different types of magnetoresistance elements, for example, a semiconductor magnetoresistance element such as Indium Antimonide (InSb), a giant magnetoresistance (GMR) element, for example, a spin valve, an anisotropic magnetoresistance element (AMR), a tunneling magnetoresistance (TMR) element, and a magnetic tunnel junction (MTJ). The magnetic field sensing element may be a single element or, alternatively, may include two or more magnetic field sensing elements arranged in various configurations, e.g., a half bridge or full (Wheatstone) bridge. Depending on the device type and other application requirements, the magnetic field sensing element may be a device made of a type IV semiconductor material such as Silicon (Si) or Germanium (Ge), or a type III-V semiconductor material like Gallium-Arsenide (GaAs) or an Indium compound, e.g., Indium-Antimonide (InSb).

As is known, some of the above-described magnetic field sensing elements tend to have an axis of maximum sensitivity parallel to a substrate that supports the magnetic field sensing element, and others of the above-described magnetic field sensing elements tend to have an axis of maximum sensitivity perpendicular to a substrate that supports the magnetic field sensing element. In particular, planar Hall elements tend to have axes of sensitivity perpendicular to a substrate, while metal based or metallic magnetoresistance elements (e.g., GMR, TMR, AMR) and vertical Hall elements tend to have axes of sensitivity parallel to a substrate.

As used herein, the term "magnetic field sensor" is used to describe a circuit that uses a magnetic field sensing element, generally in combination with other circuits. Magnetic field sensors are used in a variety of applications, including, but not limited to, an angle sensor that senses an angle of a direction of a magnetic field, a current sensor that senses a magnetic field generated by a current carried by a current-carrying conductor, a magnetic switch that senses the proximity of a ferromagnetic object, a rotation detector that senses passing ferromagnetic articles, for example, magnetic domains of a ring magnet or a ferromagnetic target (e.g., gear teeth) where the magnetic field sensor is used in combination with a back-biased or other magnet, and a magnetic field sensor that senses a magnetic field density of a magnetic field.

The terms "parallel" and "perpendicular" are used in various contexts herein. It should be understood that the terms parallel and perpendicular do not require exact perpendicularity or exact parallelism, but instead it is intended that normal manufacturing tolerances apply, which tolerances depend upon the context in which the terms are used. In some instances, the term "substantially" is used to modify the terms "parallel" or "perpendicular." In general, use of the term "substantially" reflects angles that are beyond manufacturing tolerances, for example, within +/− ten degrees.

As used herein, the term "baseline" and the phrase "baseline level" are used to describe a lowest magnitude (which may be near zero or may be some other magnetic field) of a magnetic field experienced by a magnetic field sensing element within a magnetic field sensor when the magnetic field sensor is operating in a system.

As used herein, the term "processor" is used to describe an electronic circuit that performs a function, an operation, or a sequence of operations. The function, operation, or sequence of operations can be hard coded into the electronic circuit or soft coded by way of instructions held in a memory device. A "processor" can perform the function, operation, or sequence of operations using digital values or using analog signals.

In some embodiments, the "processor" can be embodied in an application specific integrated circuit (ASIC), which can be an analog ASIC or a digital ASIC. In some embodiments, the "processor" can be embodied in a microprocessor with associated program memory. In some embodiments, the "processor" can be embodied in a discrete electronic circuit, which can be an analog or digital.

As used herein, the term "module" is used to describe a "processor."

A processor can contain internal processors or internal modules that perform portions of the function, operation, or sequence of operations of the processor. Similarly, a module can contain internal processors or internal modules that perform portions of the function, operation, or sequence of operations of the module.

While electronic circuits shown in figures herein may be shown in the form of analog blocks or digital blocks, it will be understood that the analog blocks can be replaced by digital blocks that perform the same or similar functions and the digital blocks can be replaced by analog blocks that perform the same or similar functions. Analog-to-digital or digital-to-analog conversions may not be explicitly shown in the figures, but should be understood.

In particular, it should be understood that a so-called comparator can be comprised of an analog comparator having a two state output signal indicative of an input signal being above or below a threshold level (or indicative of one input signal being above or below another input signal). However, the comparator can also be comprised of a digital circuit having an output signal with at least two states indicative of an input signal being above or below a threshold level (or indicative of one input signal being above or below another input signal), respectively, or a digital value above or below a digital threshold value (or another digital value), respectively.

As used herein, the term "predetermined," when referring to a value or signal, is used to refer to a value or signal that is set, or fixed, in the factory at the time of manufacture, or by external means, e.g., programming, thereafter. As used herein, the term "determined," when referring to a value or signal, is used to refer to a value or signal that is identified by a circuit during operation, after manufacture.

As used herein, the term "active electronic component" is used to describe an electronic component that has at least one p-n junction. A transistor, a diode, and a logic gate are examples of active electronic components. In contrast, as used herein, the term "passive electronic component" as used to describe an electronic component that does not have at least one p-n junction. A capacitor and a resistor are examples of passive electronic components.

As used herein, the terms "line" and "linear" are used to describe either a straight line or a curved line. The line can be described by a function having any order less than infinite.

Referring to FIG. 1, a circular vertical Hall (CVH) element 112 includes a circular implant and diffusion region 118 in a substrate (not shown). The CVH element 112 has a plurality of vertical Hall elements, of which a vertical Hall element 112a is but one example. In some embodiments, the common implant and diffusion region 118 can be characterized as a common epitaxial region upon a substrate, bounded by semiconductor isolation structures.

Each vertical Hall element has a plurality of Hall element contacts (e.g., four or five contacts), e.g., 112aa. Each vertical Hall element contact can be comprised of a metal contact over a contact diffusion region (a pickup) diffused into the common implant and diffusion region 118.

A particular vertical Hall element (e.g., 112a) within the CVH element 112, which, for example, can have five adjacent contacts, can share some, for example, four, of the five contacts with a next vertical Hall element (e.g., 112b). Thus, a next vertical Hall element can be shifted by one contact from a prior vertical Hall element. For such shifts by one contact, it will be understood that the number of vertical Hall elements is equal to the number of vertical Hall element contacts, e.g., thirty-two or sixty-four. However, it will also be understood that a next vertical Hall element can be shifted by more than one contact from the prior vertical Hall element, in which case, there are fewer vertical Hall elements than there are vertical Hall element contacts in the CVH element.

As shown, a center of a vertical Hall element 0 can positioned along an x-axis 120 and a center of vertical Hall element 118 can be positioned along a y-axis 122. In the exemplary CVH element 112, there are thirty-two vertical Hall elements and thirty-two vertical Hall element contacts. However, a CVH can have more than or fewer than thirty-two vertical Hall elements and more than or fewer than thirty-two vertical Hall element contacts.

In some applications, a circular magnet 114 having a north side 114*b* and a south side 114*a* can be disposed over the CVH 112. The circular magnet 114 tends to generate a magnetic field 116 having a direction from the north side 114*b* to the south side 114*a*, here shown to be pointed to a direction of about forty-five degrees relative to x-axis 120.

In some applications, the circular magnet 114 is mechanically coupled to a rotating target object, for example, an automobile steering shaft of an automobile camshaft, and is subject to rotation relative to the CVH element 112. With this arrangement, the CVH element 112, in combination with an electronic circuit described below, can generate a signal related to the angle of rotation of the magnet 114, i.e., an angle of rotation of the target object to which the magnet is coupled.

While the circular magnet 114 is shown, it should be appreciated that other magnets or other magnetic fields can be used, and, more generally, the CVH element 112 is operable to identify an angle of a magnetic field in a plane of the CVH element 112.

Figure 1A:
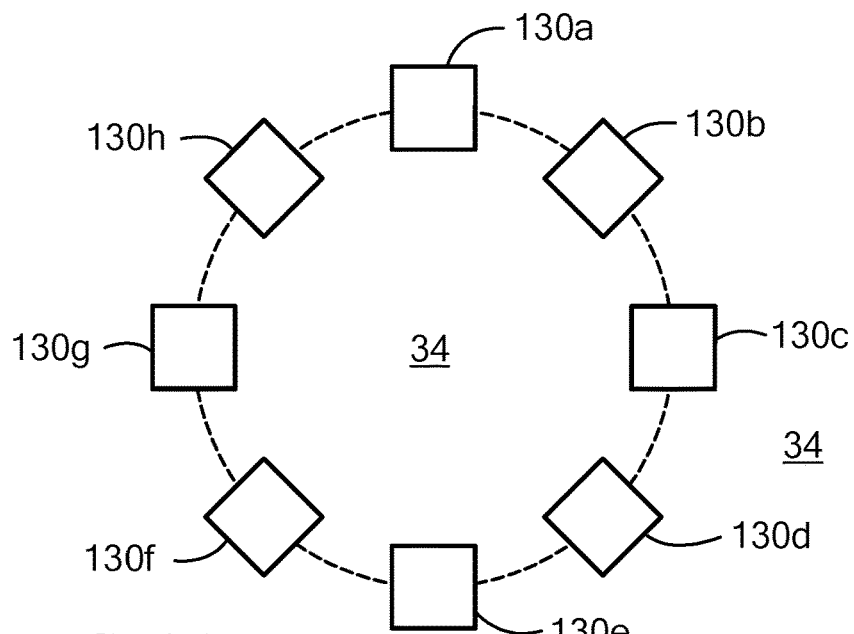
FIG. 1A is a pictorial showing a plurality of magnetic field sensing elements.

Referring now to FIG. 1A, a plurality of magnetic field sensing elements 130*a*-130*h*, in a general case, can be any type of magnetic field sensing elements. The magnetic field sensing elements 130*a*-130*h* can be, for example, separate vertical Hall elements or separate magnetoresistance elements, each having an axis of maximum response parallel to a surface of a substrate 34, each pointing in a different direction in the plane of the surface. These magnetic field sensing elements can be coupled to an electronic circuit the same as or similar to electronic circuits described below in conjunction with FIGS. 3 and 6. There can also be a magnet the same as or similar to the magnet 114 of FIG. 1 disposed proximate to the magnetic field sensing elements 130*a*-130*h*.

Figure 2:
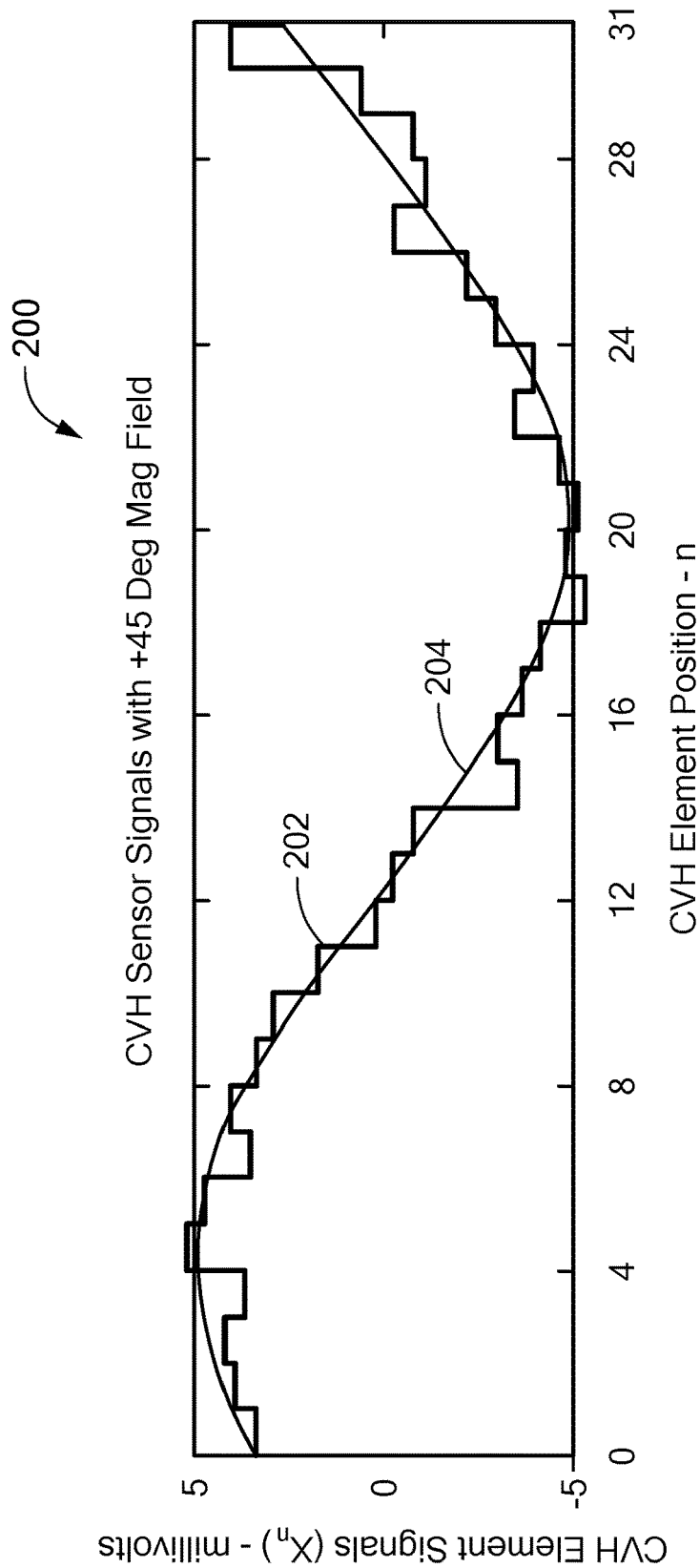
FIG. 2 is a graph showing an output signal as may be generated by the CVH element of FIG. 1 or by the plurality of magnetic field sensing elements of FIG. 1A.

Referring now to FIG. 2, a graph 200 has a horizontal axis with a scale in units of CVH vertical Hall element position, n, around a CVH element, for example, the CVH element 112 of FIG. 1. The graph 200 also has a vertical axis with a scale in amplitude in units of millivolts. The vertical axis is representative of output signal levels from the plurality of vertical Hall elements of the CVH element taken sequentially, one at a time, about the ring of contacts of the CVH element.

The graph 200 includes a signal 202 representative of output signal levels from the plurality of vertical Hall elements of the CVH taken with the magnetic field of FIG. 1 pointing in a direction of forty-five degrees.

Referring briefly to FIG. 1, as described above, vertical Hall element 0 is centered along the x-axis 120 and vertical Hall element 8 is centered along the y-axis 122. In the exemplary CVH element 112, there are thirty-two vertical Hall element contacts and a corresponding thirty-two vertical Hall elements, each vertical Hall element having a plurality of vertical Hall element contacts, for example, five contacts. In other embodiments, there are sixty-four vertical Hall element contacts and a corresponding sixty-four vertical Hall elements.

In FIG. 2, for the magnetic field 116 pointing at positive forty-five degrees, a maximum positive signal is achieved from a vertical Hall element centered at position 4, which is aligned with the magnetic field 116 of FIG. 1, such that a line drawn between the vertical Hall element contacts (e.g., five contacts) of the vertical Hall element at position 4 is perpendicular to the magnetic field. A maximum negative signal is achieved from a vertical Hall element centered at position 20, which is also aligned with the magnetic field 116 of FIG. 1, such that a line drawn between the vertical Hall element contacts (e.g., five contacts) of the vertical Hall element at position 20 is also perpendicular to the magnetic field.

A sine wave 204 is provided to more clearly show ideal behavior of the signal 202. The signal 202 has variations due to vertical Hall element offsets, which tend to cause corresponding variations of output signals causing them to be too high or too low relative to the sine wave 204, in accordance with offset errors for each element. The offset signal errors are undesirable.

Full operation of the CVH element 112 of FIG. 1 and generation of the signal 202 of FIG. 2 are described in more detail in the above-described PCT Patent Application No. PCT/EP2008/056517, entitled "Magnetic Field Sensor for Measuring Direction of a Magnetic Field in a Plane," filed May 28, 2008, which is published in the English language as PCT Publication No. WO 2008/145662.

Groups of contacts of each vertical Hall element can be used in a chopped arrangement (also referred to herein as current spinning) to generate chopped output signals from each vertical Hall element. Thereafter, a new group of adjacent vertical Hall element contacts can be selected (i.e., a new vertical Hall element), which can be offset by one element from the prior group. The new group can be used in the chopped arrangement to generate another chopped output signal from the next group, and so on.

Each step of the signal 202 is representative of an unchopped output signal, i.e., from one respective group of vertical Hall element contacts, i.e., from one respective vertical Hall element. Thus, for a CVH element having 32 vertical Hall elements taken sequentially, there are thirty-two steps in the signal 202 when current spinning is not used. However, for embodiments in which current spinning is used or in which a current swapping operation is performed, each step of the signal 202 can be comprised of several sub-steps (not shown, e.g., two sub-steps or four sub-steps). Each sub-step may, for example, be indicative of a current spinning "phase" in embodiments where current spinning is used.

Current spinning and current spinning phases are not described herein in detail, but should be understood.

It will be understood that a phase of the signal 202 is related to an angle of the magnetic field 116 of FIG. 1 relative to position zero of the CVH element 112. It will also be understood that a peak amplitude of the signal 202 is generally representative of a strength of the magnetic field 116. Using electronic circuit techniques described above in PCT Patent Application No. PCT/EP2008/056517, or using other techniques described below, a phase of the signal 202 (e.g., a phase of the signal 204) can be found and can be used to identify the pointing direction of the magnetic field 116 of FIG. 1 relative to the CVH element 112.

It should be understood that the phase of the signal 202, used to identify an angle of a detected magnetic field in a plane of the CVH element, can be determined in a number of ways. With some ways, it is necessary to achieve and entire cycle of the signal 202 before the angle of the magnetic field can be determined. Thus, it may be desirable to have a frequency of the signal 202 as high as possible. However, higher frequencies also tend to use more power.

The signal 202 is also referred to herein as a "sequential signal" 202, which will be understood to be comprised of sequential ones of a plurality of magnetic field signals or "steps," each magnetic field signal generated by a respective one of a plurality of magnetic field sensing elements, e.g., the plurality of vertical Hall elements within a CVH element. While the sequential signal 202 is shown to be an analog signal having analog voltage steps, it should be understood that an equivalent digital sequential signal can be generated merely by analog-to-digitally converting the analog sequential signal.

Circuits described below can make use of two or more CVH elements coupled to electronic circuits to identify at least a phase, and therefore, an angle of a magnetic field in a plane, the phase being a phase of a CVH element signal like the CVH element signal 202 of FIG. 2. However, in other embodiments, the two or more CVH elements can be replaced by respective pluralities of separate magnetic field sensing elements, for example, groups of vertical Hall elements or groups of magnetoresistance elements.

Figure 3:
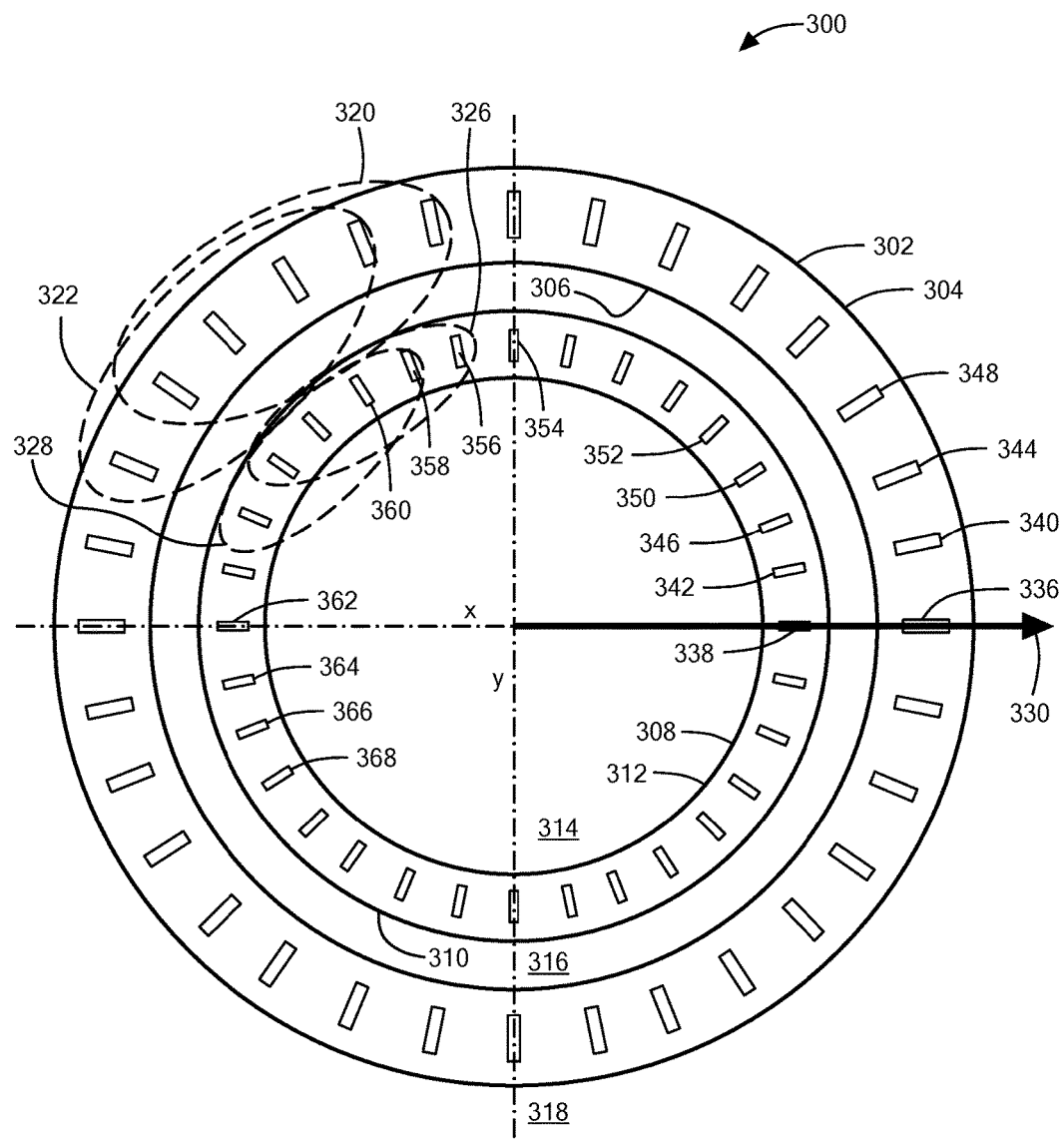
FIG. 3 is a pictorial showing two circular vertical Hall (CVH) sensing elements arranged concentrically, each having a respective plurality of vertical Hall elements, each arranged in a respective circle over a respective common circular implant region upon a substrate, a relative rotation angle between the two circular vertical Hall (CVH) sensing elements.

Referring now to FIG. 3, a dual CVH element 300 can include a first CVH element 302 disposed concentrically with a second CVH element 308.

The first CVH element 302 can have an outer boundary 304 and an inner boundary 306 between which a common circular implant and diffusion region is formed and in which electrons can flow.

The second CVH element 308 can have an outer boundary 310 and an inner boundary 312 between which a common circular implant and diffusion region is formed and in which electrons can flow.

Regions 314, 316, 318 can be barrier regions formed by deep diffusions into an epi layer in which the first and second CVH element 302, 308 are also formed. The regions 314, 316, 318 effectively block the flow of electrons.

As used herein, the term "contact" is used to describe a metallized connection of a semiconductor structure, for example, metal plating forming a contact. In turn, a contact provides a low resistance electrical coupling to a pickup, which is a diffusion into the semiconductor structure.

The first CVH element 302 can include a plurality of contacts, and associate pickups thereunder, of which a contact 354 is but one example. There can be any number of contacts in the first CVH element 302, for example, thirty-two or sixty-four contacts. The number of contacts is selected in accordance with a desired basic angular resolution of the CVH element and in accordance with a desired small diameter of the CVH element.

Similarly, the second CVH element 308 can include a plurality of contacts, and associate pickups thereunder, similar to the contact 324. There can be any number of contacts in the second CVH element 308, for example, thirty-two or sixty-four contacts. The number of contacts is selected in accordance with a desired basic angular resolution of the CVH element and in accordance with a desired small diameter of the CVH element.

In some embodiments, there can be the same number of contacts in the first and second CVH elements 302, 308.

The first CVH element 302 can include a plurality of vertical Hall elements, e.g., 320, 322, which can each contain a plurality of vertical Hall element contacts.

Similarly, the second CVH element 308 can include a plurality of vertical Hall elements, e.g., 326, 328, which can each contain a plurality of vertical Hall element contacts.

As typified by the graph 200 of FIG. 2, first sequential samples can be taken from the plurality of vertical Hall elements of the first CVH element 302 and second sequential samples can be taken from the plurality of vertical Hall elements of the second CVH element 308. The first and second sequential samples can be taken in different ways.

In some embodiments, vertical Hall elements of the first and second CVH elements 302, 308 can be sampled separately to generate two sequential signals with samples taken at the same time from the first and second CVH elements 302, 308 described more fully below in conjunction with FIG. 4. In other embodiments, vertical Hall elements of the first and second CVH elements 302, 308 can be sampled in an interleaved fashion described more fully below in conjunction with FIGS. 4A and 4B.

For embodiments that sample the vertical Hall elements of the first and second CVH elements 302, 308 separately, the resulting sequential signals (see, e.g., signal 202 of FIG. 2) can be at any relative phase versus CVH element position.

In a first sequencing embodiment, the first CVH element 302 and second CVH element 308 can generate samples in the following order:
time 1 vertical Hall elements centered at contacts 336, 338
time 2 vertical Hall elements centered at contacts 340, 342
time 3 vertical Hall elements centered at contacts 344, 346
time 4 vertical Hall elements centered at contacts 348, 350; and so on around the CVH elements 302, 308.

In the first sequencing embodiment, successive samples generated by the first and second CVH elements 302, 308 can continue around the first and second CVH elements 302, 308 such that vertical Hall elements of the first and second CVH elements 302, 308 remain aligned with each other during the sequencing around the first and second CVH elements 302, 308.

The first sequencing embodiment may take more power than for a signal CVH element alone, since two vertical Hall elements are powered on at the same time. However, with the first sequencing embodiment, combining of sequential samples generated by the first and second CVH elements 302, 308, in particular, adding or subtracting first and second sequential samples from aligned vertical Hall elements to generate a combined sequential signal (similar to sequential signal 202 of FIG. 2), can result in improvements described below.

Equation (1) is indicative of an improvement described below associated with the first sequencing embodiment:

$$(A*\sin(\omega t)+\text{Off1})+(B*\sin(\omega t)+\text{Off2})=(A+B)*\sin(\omega t)+(\text{Off1}+\text{Off2}) \quad (1)$$

where: Off1 and Off2 are DC offset voltages associated with vertical Hall elements of the first and second CVH element 302, 308, respectively.

It should be understood that, in the first sequencing embodiment, a resulting signal amplitude, A+B, is greater than an amplitude, A or B, from either of the CVH sensing elements 302, 308 alone. However, electrical noise is only increased by a factor of sqrt (2). Thus, the signal to noise ratio is improved in the first sequencing embodiment.

In a second sequencing embodiment, the first CVH element 302 and second CVH element 308 can generate samples in the following order:
time 1 vertical Hall elements centered at contacts 336, 362
time 2 vertical Hall elements centered at contacts 340, 364
time 3 vertical Hall elements centered at contacts 344, 366
time 4 vertical Hall elements centered at contacts 348, 368, and so on around the CVH elements 302, 308.

In the second sequencing embodiment, successive samples generated by the first and second CVH elements 302, 308 can continue around the first and second CVH elements 302, 308 such that centers of vertical Hall elements of the first and second CVH element s 302, 308 remain offset by a relative one hundred eighty degrees during the sequencing of the first and second CVH elements 302, 308. In the second sequencing embodiment, sequential signals (see, e.g., sequential signal 202 of FIG. 2) generated by the first and second CVH elements 302, 308 can be approximately one hundred eighty degrees apart relative to each other.

Equation (2) is indicative of improvements described below associated with the second sequencing embodiment:

$$[A*\sin(\omega t)+\text{Off1}]-[B*\sin(\omega t+180)+\text{Off2}]=[(A+B)*\sin(\omega t)]+(\text{Off1}-\text{Off2}) \quad (2)$$

It should be understood that, like in the first sequencing embodiment, in the second sequencing embodiment, resulting signal amplitude is A+B is greater than an amplitude A or B from either of the CVH sensing elements 304, 308 alone. However, electrical noise is only increased by a factor of sqrt (2). Thus, the signal to noise ratio is improved in the second sequencing embodiment.

In a third sequencing embodiment, the first CVH element 302 and second CVH element 308 can generate samples in the following order:
time 1 vertical Hall elements centered at contacts 336, 354
time 2 vertical Hall elements centered at contacts 340, 356
time 3 vertical Hall elements centered at contacts 344, 358
time 4 vertical Hall elements centered at contacts 348, 360, and so on around the CVH elements 302, 308.

In the third sequencing embodiment, successive samples generated by the first and second CVH elements 302, 308 can continue around the first and second CVH elements 302, 308 such that centers of vertical Hall elements of the first and second CVH element s 302, 308 remain offset by a relative ninety degrees during the sequencing of the first and second CVH elements 302, 308. In the third sequencing embodiment, sequential signals (see, e.g., sequential signal 202 of FIG. 2) generated by the first and second CVH elements 302, 308 can be approximately ninety degrees apart relative to each other.

Equation (3) is indicative of an improvement described below associated with the third sequencing embodiment.

$$\begin{aligned}&= [A*\sin(\omega t) + \text{Off1}]*[B*\cos(\omega t) + \text{Off2}] \quad (3)\\ &= [(A*B/2)*\sin(2\omega t)] + [A*\text{Off2}*\sin(\omega t)] +\\ &\quad [B*\text{Off1}*\cos(\omega t)] + [\text{Off1}*\text{Off2}]\end{aligned}$$

With the third sequencing embodiment, combining of sequential samples generated by the first and second CVH elements 302, 308, in particular, multiplying associated first and second sequential signals, can result in a combined sequential signal at twice the fundamental frequency (2 wt) of one sequential signal alone from one CVH element. Recall from discussion above in conjunction with FIG. 2, that for some arrangements it is necessary to achieve an entire cycle of a sequential signal, e.g., the signal 202 of FIG. 2, in order to identify a detected angle of a magnetic field. Thus, the combined sequential signal at twice the fundamental frequency of one CVH element alone can result in faster measurement of a magnetic field direction.

While first, second, and third sequencing embodiments described above take pairs of samples from the first and second CVH elements 302, 308 at the same time, in other similar sequencing embodiments, samples are taken from the first and second CVH elements 302, 308 sequentially at different times, i.e., one vertical Hall element can be powered on at a time. The sequential arrangements can result in power consumption over each full sequence around the CVH element 302, 308 being approximately the same as that achieved with each full sequence around one CVH element.

In a fourth sequencing embodiment, the first CVH element 302 and second CVH element 308 can generate samples in the following order:
time 1 vertical Hall element centered at contact 336
time 2 vertical Hall element centered at contact 342
time 3 vertical Hall element centered at contact 344
time 4 vertical Hall element centered at contact 350; and so on around the CVH elements 302, 308.

In the fourth sequencing embodiment, successive samples generated by the first and second CVH elements 302, 308 can continue around the first and second CVH elements 302, 308 such that centers of vertical Hall elements of the first and second CVH elements 302, 308 sequence in the same angular steps, alternating between the first CVH element 302 and the second CVH element 308.

Sampling speed around the first and second CVH elements 302, 308 may be greater than for one CVH element alone, because, while a vertical Hall element of one CVH element is being sampled, a vertical Hall element of the other CVH element can be charging to prepare for a next sample, back and forth between the two CVH elements 302, 308. In addition, an angular resolution may be improved relative to one CVH element.

Figure 3A:
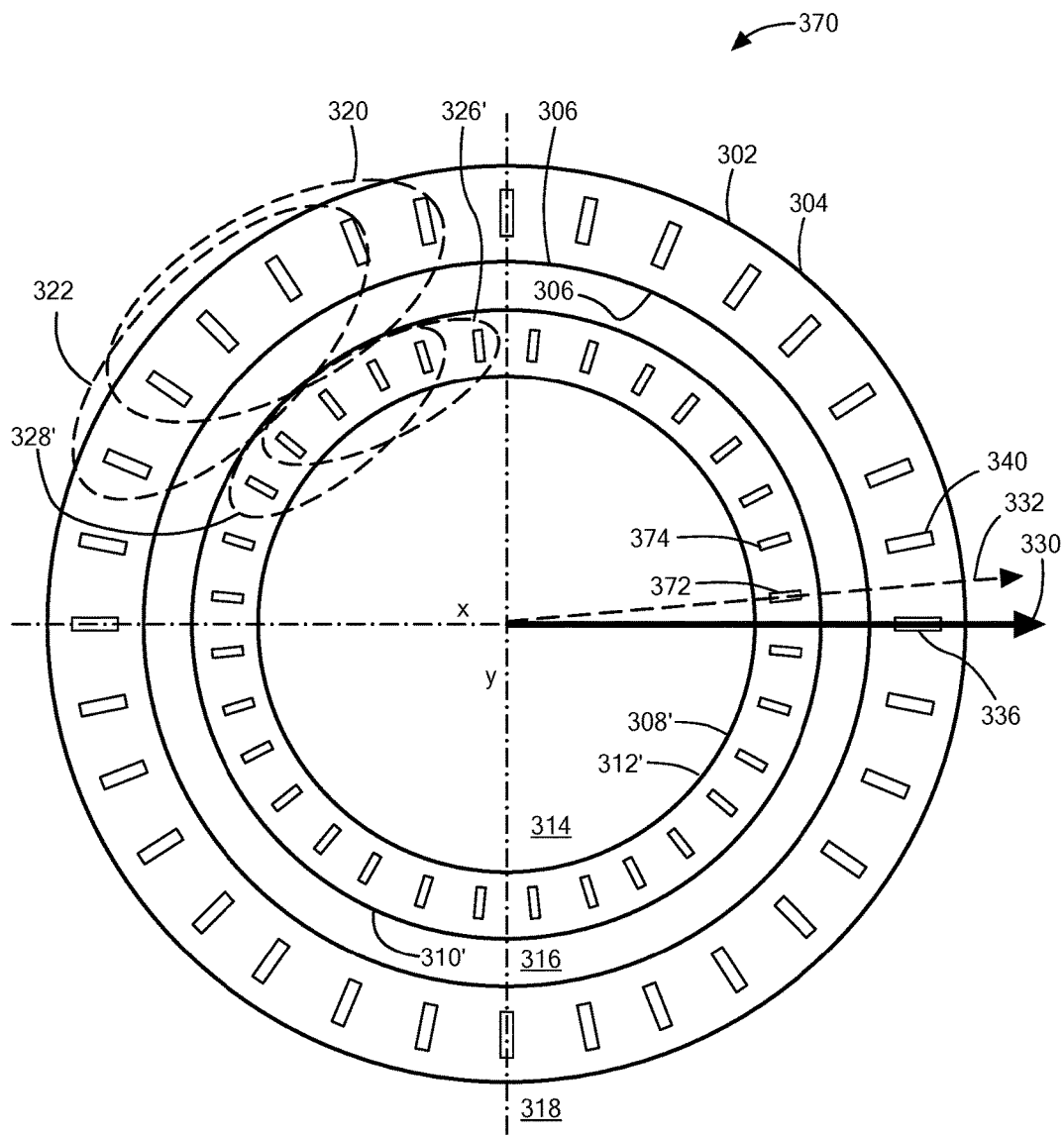
FIG. 3A is a pictorial showing another two circular vertical Hall (CVH) sensing elements arranged concentrically, each having a respective plurality of vertical Hall elements, each arranged in a respective circle over a respective common circular implant region upon a substrate, a different relative rotation angle between the two circular vertical Hall (CVH) sensing elements.

Referring now to FIG. 3A, in which like elements of FIG. 3 have like reference designations, a dual CVH element 370 includes the first CVH element 302 disposed concentrically with a second CVH element 308'. The second CVH element 308' is similar to the CVH element 308 of FIG. 3. However, contacts of the second CVH element 308' are rotated from contacts of the first CVH element 302 by one half of a separation of contacts (i.e., one half of an angle between contacts) of the first and second CVH elements 302, 308' as represented by arrow 332. Other relative angular separations are also possible.

While the arrangement of FIG. 3A can be used in ways similar to any of the sequencing embodiments described above as sequencing embodiments one through four, this arrangement is particularly suited for a fifth sequencing embodiment.

In the fifth sequencing embodiment, the first CVH element 302 and second CVH element 308 can generate samples in the following order:
time 1 vertical Hall element 336
time 2 vertical Hall element 372
time 3 vertical Hall element 340
time 4 vertical Hall element 374; and so on around the CVH elements 302, 308'.

The fifth sequencing embodiment can achieve a higher basic angular resolution of measured magnetic fields, roughly half the basic angular resolution of one of the CVH elements 302, 308' alone. Sampling speed around the first and second CVH elements 302, 308' may be slower than for the fourth sequencing embodiment above, because, while the fourth sequencing embodiment essentially uses every other contact of each one of the CVH elements 302, 308, the fifth sequencing embodiment uses every contact.

Figure 3B:
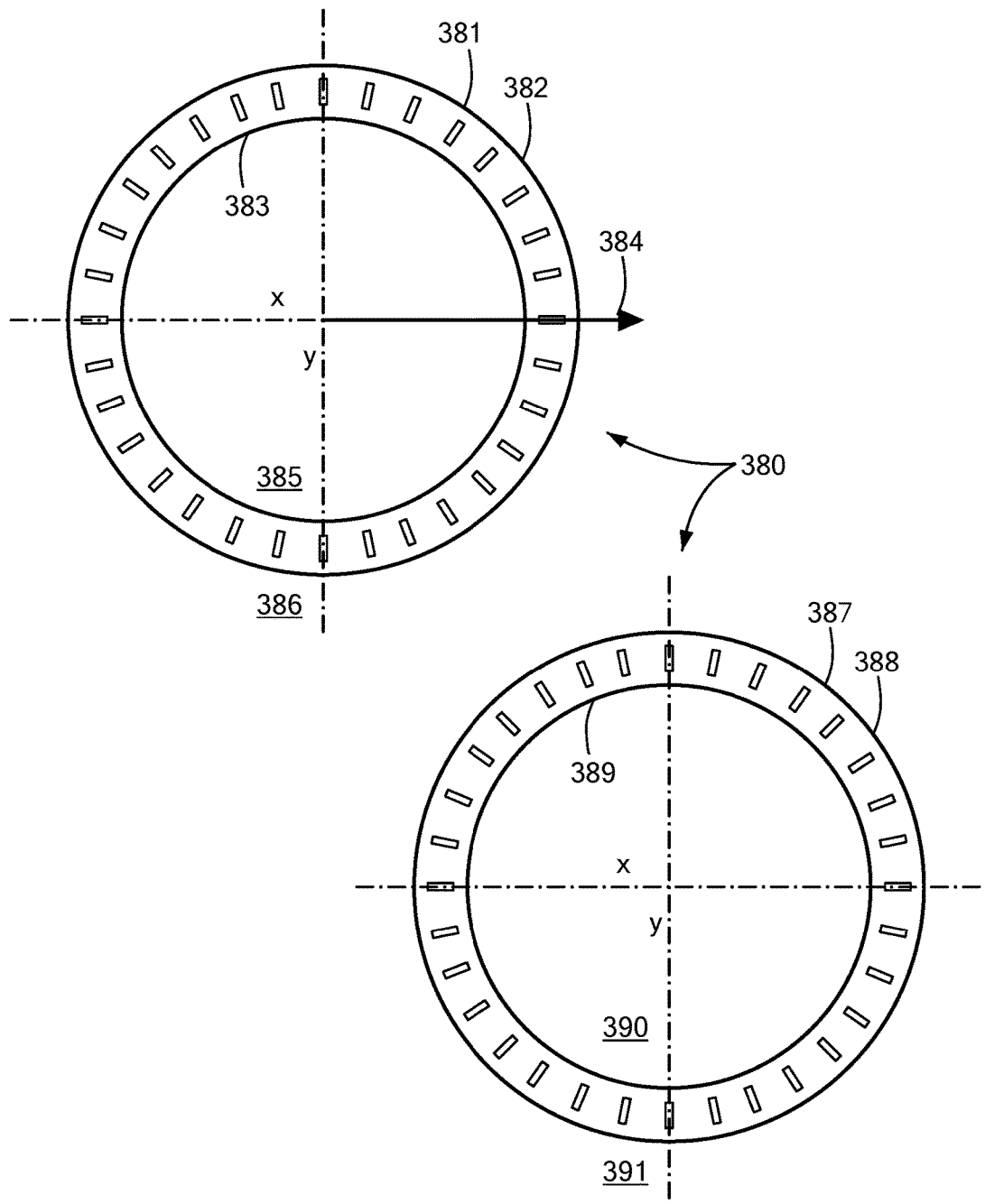
FIG. 3B is a pictorial showing two circular vertical Hall (CVH) sensing elements arranged non-concentrically, each having a respective plurality of vertical Hall elements, each arranged in a respective circle over a respective common circular implant region upon a substrate, a relative rotation angle between the two circular vertical Hall (CVH) sensing elements.

Referring now to FIG. 3B, a dual CVH element 380 includes a first CVH element 381 disposed non-concentrically with a second CVH element 387.

The first CVH element 381 can have an outer boundary 382 and an inner boundary 383 between which a common circular implant and diffusion region is formed and in which electrons can flow.

The second CVH element 387 can have an outer boundary 388 and an inner boundary 389 between which a common circular implant and diffusion region is formed and in which electrons can flow.

Regions 385, 386, 390, 391 can include barrier regions formed by deep diffusions into an epi layer in which the first and second CVH elements 381, 387 are also formed. The regions 385, 386, 390, 391 effectively block the flow of electrons.

The first and second CVH elements 381, 387 can each have a respective plurality of contacts, typified by small rectangular boxes. As described above in conjunction with FIG. 3, the plurality of contacts can be arranged as a plurality of vertical Hall elements, each having, for example, five contacts.

It should be apparent that the first CVH element 381 is like the first CVH element 302 of FIG. 3 and the second CVH element 387 is like the second CVH element 308 of FIG. 3 (i.e., aligned contacts). Thus, sequencing embodiments one through four described above in conjunction with FIG. 3 apply also to the dual CVH element 380. The same advantages also apply.

It may be advantageous that the first and second CVH elements 381, 387 be in close proximity so that they can sense substantially the same magnetic field direction. However, in other embodiments, the first and second CVH elements 381, 387 can be separated by a larger predetermined distance so that they do not sense essentially the same magnetic fields, and the signals from the CVH element 381, 387 can be combined in a differential arrangement.

In some embodiments, the first and second CVH elements 381, 387 can have the same diameter. However, in other embodiments, one of the first or second CVH elements 381, 387 can have a diameter smaller than the other.

Figure 3C:
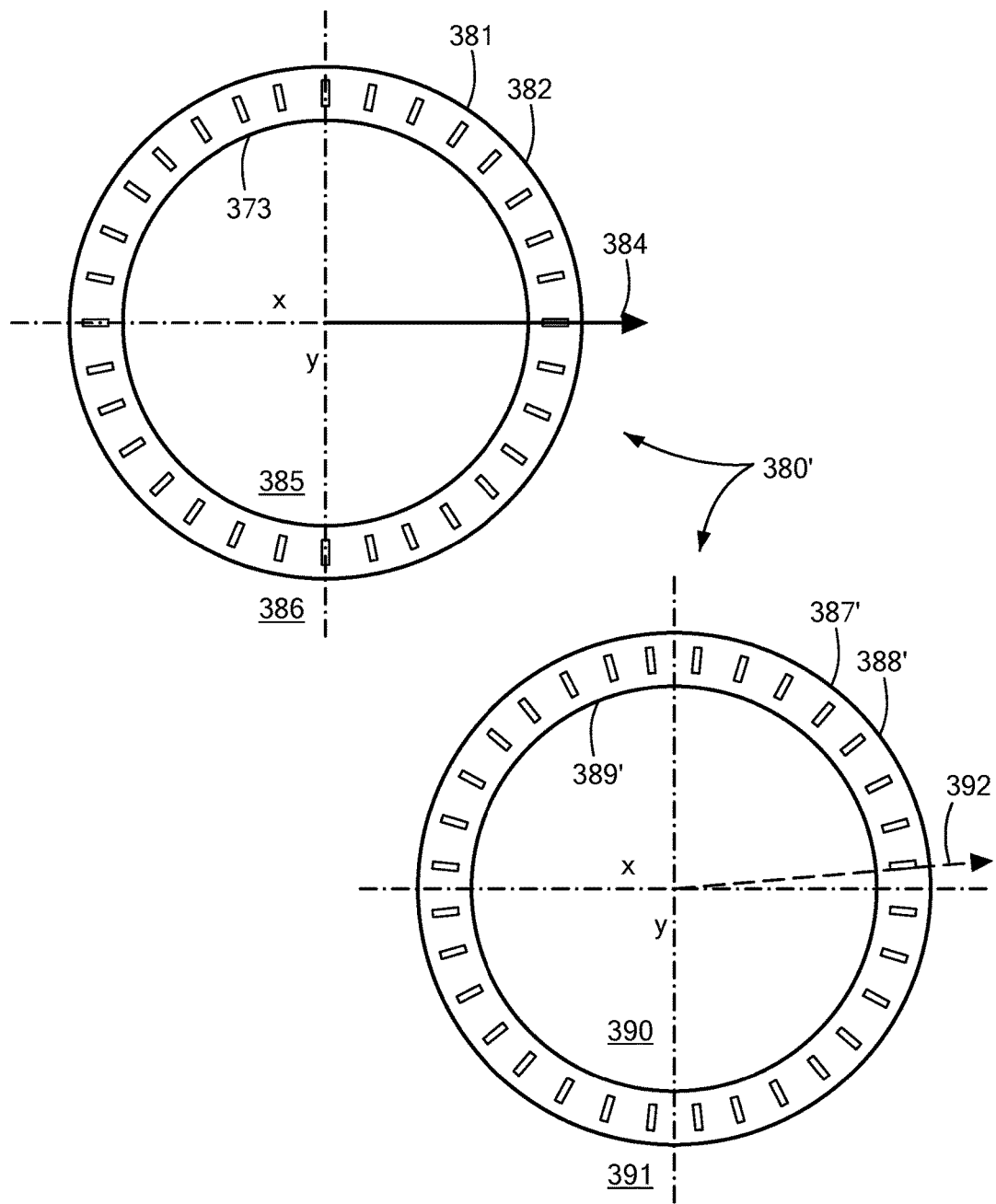
FIG. 3C is a pictorial showing another two circular vertical Hall (CVH) sensing elements arranged non-concentrically, each having a respective plurality of vertical Hall elements, each arranged in a respective circle over a respective common circular implant region upon a substrate, a different relative rotation angle between the two circular vertical Hall (CVH) sensing elements.

Referring now to FIG. 3C, a dual CVH element 380' includes the first CVH element 381 of FIG. 3B disposed non-concentrically with a second CVH element 387', which is similar to the second CVH element 387 of FIG. 3B. Contacts of the second CVH element 387' are rotated from contacts of the first CVH element 381 and from contacts of the second CVH element 387 of FIG. 3B by one half of a separation of contacts (i.e., one half of an angle between contacts) of the first and second CVH elements 381, 387 as represented by arrow 392. Other relative angular separations are also possible.

The second CVH element 387' can have an outer boundary 388' and an inner boundary 389', between which a common circular implant and diffusion region is formed and in which electrons can flow.

Regions 385, 386, 390, 391 can include barrier regions formed by deep diffusions into an epi layer in which the first and second CVH element 302, 308 are also formed. The regions 385, 386, 390, 391 effectively block the flow of electrons.

The first and second CVH elements 381, 387' can each have a respective plurality of contacts, typified by small rectangular boxes. As described above in conjunction with FIG. 3, the plurality of contacts can be arranged as a plurality of vertical Hall elements, each having, for example, five contacts.

It should be apparent that the first CVH element 381 is like the first CVH element 302 of FIG. 3A and the second CVH element 387' is like the second CVH element 308' of FIG. 3A (i.e., contacts are offset by half a distance (or half and angle) between contacts). Thus, the fifth sequencing embodiment described above in conjunction with FIG. 3A applies also to the dual CVH element 380'. The same advantages also apply.

It may be advantageous that the first and second CVH elements 381, 387' be in close proximity so that they can sense substantially the same magnetic field direction.

In some embodiments, the first and second CVH elements 381, 387' can have the same diameter. However, in other embodiments, one of the first or second CVH elements 381, 387' can have a diameter smaller than the other.

While dual CVH elements are described above, in other embodiments, there can be more than two CVH elements, operating in a similar way to the sequencing embodiments described above as sequencing embodiments one through five.

Magnetic field sensors are described below that have dual CVH elements (but which can include more than two CVH elements in other embodiments). The dual CVH elements can be any of the dual CVH elements of FIG. 3, 3A, 3B, or 3C. Any of the sequencing embodiments described above as sequencing embodiments one through five can be used. Other sequencing embodiments are also possible.

Figure 4:
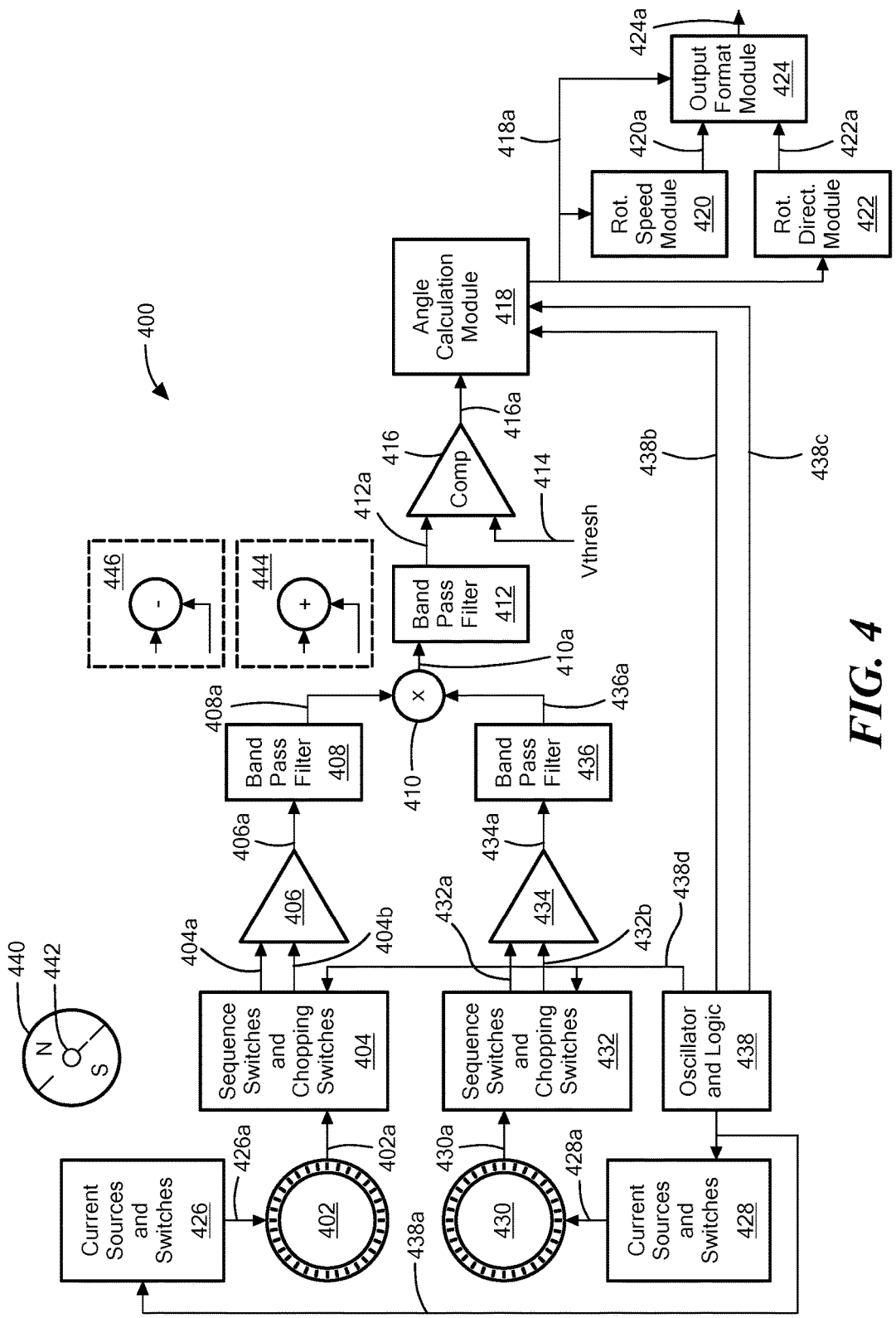
FIG. 4 is a block diagram showing a magnetic field sensor that can have the two circular vertical Hall (CVH) sensing elements of FIGS. 3-3C.

Referring now to FIG. 4, a magnetic field sensor 400 can include a first CVH element 402 and a second CVH element 430, considered together to be a dual CVH element. The first CVH element 402 can be coupled to receive current signals 426a from a current sources and switches module 426 operable to provide a current to sequential ones of vertical Hall elements within the first CVH element 402. The second CVH element 430 can be coupled to receive current signals 428a from a current sources and switches module 428 operable to provide a current to sequential ones of vertical Hall elements within the second CVH element 430.

The current sources and switches modules 426, 428 can be coupled to receive a clock signal 438a from an oscillator and logic module 438. A rate of the clock signal 438a can determine a rate at which the vertical Hall elements within the first and second CVH elements 402, 430 sequence around the rings.

A physical coupling 402a couples the first CVH element 402 to a sequences switches and chopping switches module 404. The physical coupling 402a can couple all output nodes of the first CVH element 402 to the sequences switches and chopping switches module 404, sequential ones of which are selected to provide a differential sequential signal 404a, 404b. The sequences switches and chopping switches module 404 can also perform chopping, also referred to as current spinning. Chopping is described above in conjunction with FIG. 2. The sequences switches and chopping switches module 404 can generate the differential sequential signal 404a, 404b, which can be the same as or similar to the sequential signal 202 of FIG. 2.

Similarly, a physical coupling 430a couples the second CVH element 430 to a sequences switches and chopping switches module 432. The physical coupling 430a can couple all output nodes of the second CVH element 430 to the sequences switches and chopping switches module 432, sequential ones of which are selected to provide a differential sequential signal 432. The sequences switches and chopping switches module 432 can also perform chopping, also referred to as current spinning. The sequences switches and chopping switches module 432 can generate a differential sequential signal 432a, 432b, which can be the same as or similar to the sequential signal 202 of FIG. 2.

It will be apparent that the sequence switches and chopping switches modules 404, 432 in combination with the current sources and switches modules 426, 428 can generate the sequence described above as the Second and third sequencing embodiments.

An amplifier 406 can receive the differential sequential signal 404a, 404b and can generate an amplified signal 406a. A band pass filter 408 can received the amplified signal 406a and can generate a filtered signal 408a. An amplifier 434 can receive the differential sequential signal 432a, 432b can generate and amplified signal 434a. A band pass filter 436 can receive the amplified signal 434a and can generate a filtered signal 436a. The filtered signals 408a, 436a can be similar to the ideal signal 204 of FIG. 2.

A multiplication module 410 can receive the filtered signals 406a, 434a and can generate a multiplied, i.e., combined, sequential signal 410a. The combined sequential signal 410a is also referred to herein as a product signal 410a. It should be understood that the multiplication module 410 can be used in the above-described second and third sequencing embodiments in combination with equation (3) above.

The combined sequential signal, at a higher frequency according to equation (3) can be received by a band pass filtered 412 centered at the higher frequency and can generate a filtered signal 412a. The filtered signals 412a can be similar to the ideal signal 204 of FIG. 2, but at double the frequency.

A comparator 416 can receive the filtered signal 412a, receive a DC threshold signal 414 and can generate a two-state comparison signal 416a.

An angle calculation module 418 can receive the comparison signal 416a, can receive clock signals 438b, 438c, and can identify a relative phase of the comparison signal 416a, relative to one of the clock signals 438b, 438c. It should be understood that the relative phase is related to an angle of a sensed magnetic field in a plane of the first and second CVH elements 402, 430 generated by a magnet, for example, a circular magnet 440 coupled to a shaft 442 and operable to rotate.

The angle calculation module 418 can generate an angle signal 418a comprising information about the angle of the sensed magnetic field. In some embodiments, the angle signal 418a can have a digital count value related to the sensed angle of the magnetic field.

A rotation speed module 420 can be coupled to receive the angle signal 418a and can be operable to generate a speed signal 420a indicative of a speed of movement, e.g., a speed of rotation, of a magnetic field as may be generated by the rotating magnet 440.

A rotation direction module 422 can be coupled to receive the angle signal 418a and can be operable to generate a direction signal 422a indicative of a direction of movement, e.g., a direction of rotation, of a magnetic field as may be generated by the rotating magnet 440.

An output format module 424 can receive one or more of the angle signal 418a, the speed signal 420a, or the direction signal 422a, and can generate an output signal 424a having one or more of angle information, speed information, or direction information.

In an alternate embodiment, the multiplication module 410 can be replaced by a summing module 444 or a differencing module 446 in accordance with the above described first or second sequencing embodiments.

Figure 4A:
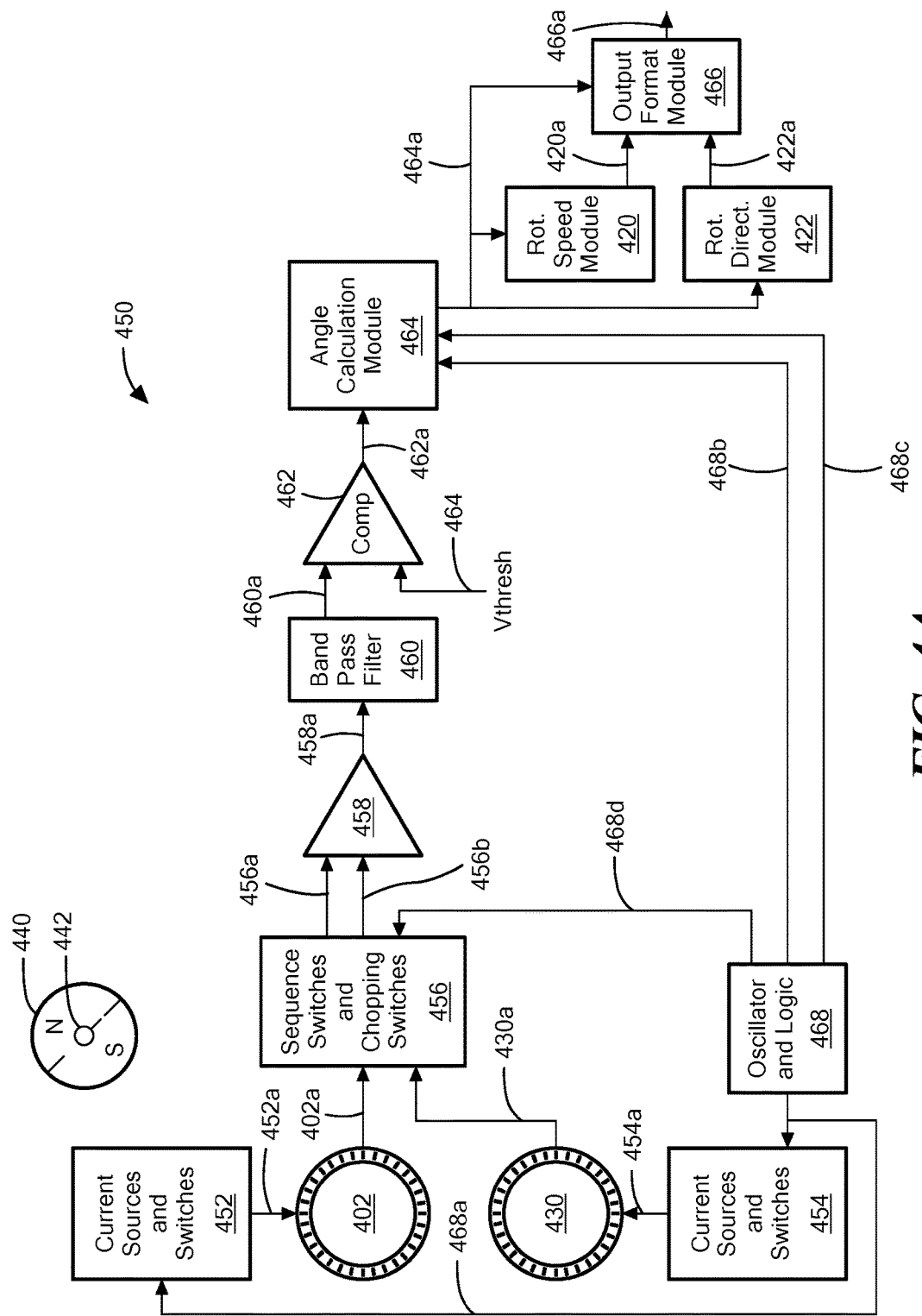
FIG. 4A is a block diagram showing another magnetic field sensor that can have the two circular vertical Hall (CVH) sensing elements of FIGS. 3-3C.

Referring now to FIG. 4A, in which like elements of FIG. 4 are have like reference designations, a magnetic field sensor 450 can include the first CVH element 402 and the second CVH element 430, considered together to be a dual CVH element. The first CVH element 402 can be coupled to receive current signals 452a from a current sources and switches module 452 operable to provide a current to sequential ones of vertical Hall elements within the first CVH element 402. The second CVH element 430 can be coupled to receive current signals 454a from a current sources and switches module 454 operable to provide a current to sequential ones of vertical Hall elements within the second CVH element 430.

The current sources and switches modules 452, 454 can be coupled to receive a clock signal 468a from an oscillator and logic module 468. A rate of the clock signal 468a can determine a rate at which the vertical Hall elements within the first and second CVH elements 402, 430 sequence around the rings.

A physical coupling 402a couples the first CVH element 402 to a sequences switches and chopping switches module 456. The physical coupling 402a can couple all output nodes of the first CVH element 402 to the sequences switches and chopping switches module 456.

Similarly, a physical coupling 430a couples the second CVH element 430 to the sequences switches and chopping switches module 456. The physical coupling 430a can couple all output nodes of the second CVH element 430 to the sequences switches and chopping switches module 456.

The sequences switches and chopping switches module 456 can generate a differential combined sequential signal 456a, 456b that can include samples from both the first and second CVH elements 402, 430. The sequences switches and chopping switches module 456 can also perform chopping, also referred to as current spinning. Chopping is described above in conjunction with FIG. 2. The sequences switches and chopping switches module 456 can generate the differential combined sequential signal 456a, 456b, which can be the same as or similar to the sequential signal 202 of FIG. 2.

It will be apparent that the sequence switches and chopping switches modules 452, 454 in combination with the current sources and switches module 456 can generate various ones of the sequences described above as first, fourth, or fifth sequencing embodiments.

An amplifier 458 can receive the differential combined sequential signal 456a, 456b and can generate an amplified signal 454a. A band pass filter 460 can received the amplified signal 458a and can generate a filtered signal 460a. The filtered signal 460a can be similar to the ideal signal 204 of FIG. 2.

A comparator 462 can receive the filtered signal 460a, receive a DC threshold signal 464, and can generate a two-state comparison signal 462a.

An angle calculation module 464 can receive the comparison signal 462a, can receive clock signals 468b, 468c, and can identify a relative phase of the comparison signal 462a, relative to one of the clock signals 468b, 468c. It should be understood that the relative phase is related to an angle of a sensed magnetic field in a plane of the first and second CVH elements 402, 430 generated by a magnet, for example, the circular magnet 440 coupled to a shaft 442 and operable to rotate.

The angle calculation module 464 can generate an angle signal 464a comprising information about the angle of the sensed magnetic field. In some embodiments, the angle signal 464a can have a digital count value related to the sensed angle of the magnetic field.

The rotation speed module 420 can be coupled to receive the angle signal 464a and can be operable to generate the speed signal 420a indicative of the speed of movement, e.g., the speed of rotation, of a magnetic field as may be generated by the rotating magnet 440.

The rotation direction module 422 can be coupled to receive the angle signal 464a and can be operable to generate the direction signal 422a indicative of a direction of movement, e.g., a direction of rotation, of a magnetic field as may be generated by the rotating magnet 440.

An output format module 466 can receive one or more of the angle signal 464a, the speed signal 420a, or the direction signal 422a, and can generate an output signal 466a having one or more of angle information, speed information, or direction information.

Figure 4B:
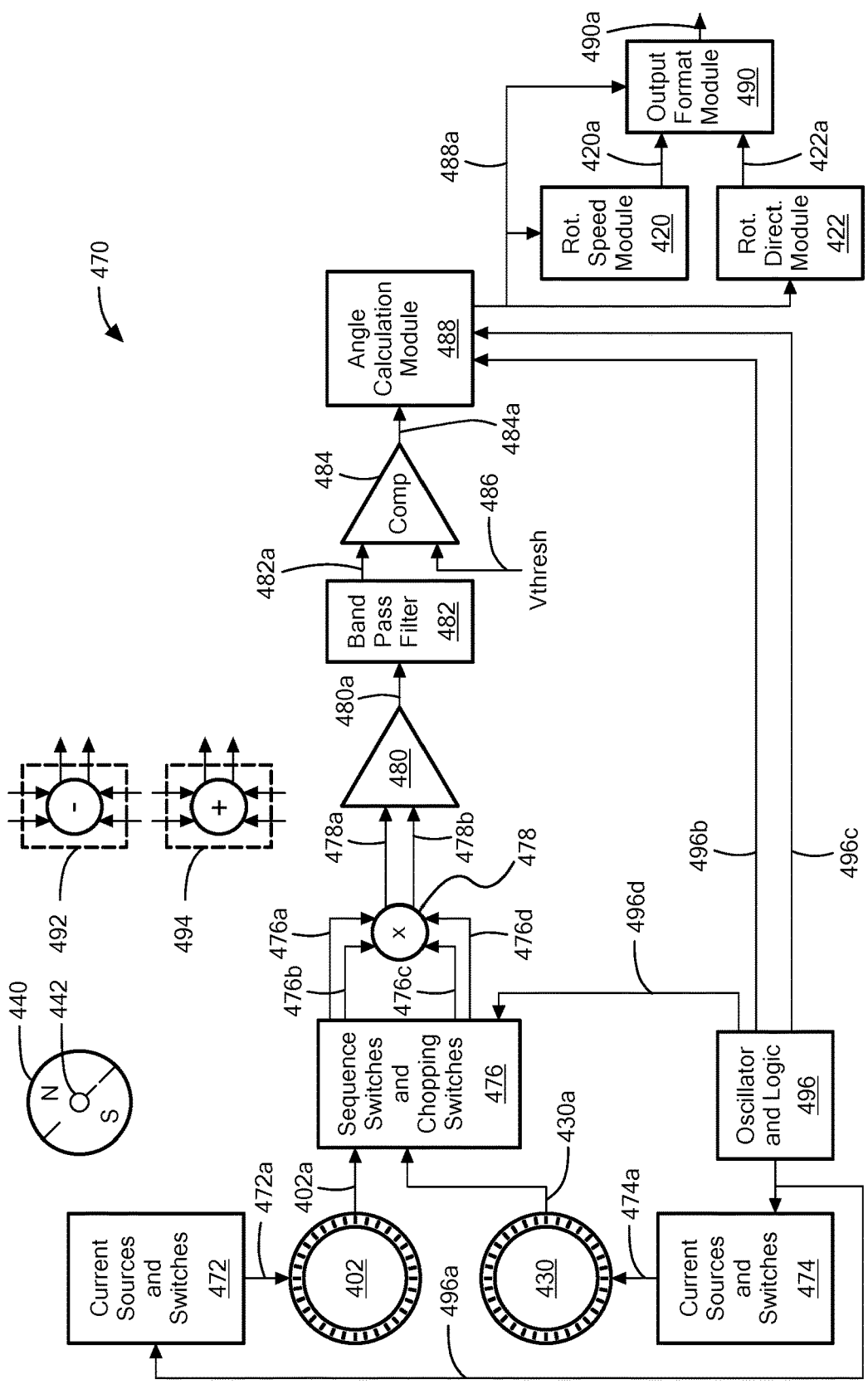
FIG. 4B is a block diagram showing another magnetic field sensor that can have the two circular vertical Hall (CVH) sensing elements of FIGS. 3-3C.

Referring now to FIG. 4B, in which like elements of FIG. 4 are have like reference designations, a magnetic field sensor 470 can include the first CVH element 402 and the second CVH element 430, considered together to be a dual CVH element. The first CVH element 402 can be coupled to receive current signals 472a from a current sources and switches module 472 operable to provide a current to sequential ones of vertical Hall elements within the first CVH element 402. The second CVH element 430 can be coupled to receive current signals 474a from a current sources and switches module 474 operable to provide a current to sequential ones of vertical Hall elements within the second CVH element 430.

The current sources and switches modules 472, 474 can be coupled to receive a clock signal 496a from an oscillator and logic module 496. A rate of the clock signal 496a can determine a rate at which the vertical Hall elements within the first and second CVH elements 402, 430 sequence around the rings.

A physical coupling 402a couples the first CVH element 402 to a sequences switches and chopping switches module 476. The physical coupling 402a can couple all output nodes of the first CVH element 402 to a sequences switches and chopping switches module 476.

Similarly, a physical coupling 430a couples the second CVH element 430 to the sequences switches and chopping switches module 476. The physical coupling 430a can couple all output nodes of the second CVH element 430 to the sequences switches and chopping switches module 476.

The sequences switches and chopping switches module 476 can generate a differential sequential signal 476a, 476b that can include samples from the first CVH elements 402. The sequences switches and chopping switches module 476 can also generate a differential sequential signal 476c, 476d that can include samples from the second CVH elements 432. The sequences switches and chopping switches module 476 can also perform chopping, also referred to as current spinning. Chopping is described above in conjunction with FIG. 2.

It will be apparent that the sequence switches and chopping switches modules 476 in combination with the current sources and switches modules 472, 474 can generate the sequence described above as the third sequencing embodiment.

A multiplication module 478 can receive the differential sequential signal 476a, 476b and the differential sequential signal 476c, 476d and can generate a multiplied, i.e., combined, differential sequential signal 478a, 478b. The combined differential sequential signal 478a, 478b is also referred to herein as a product signal 478a, 478b. It should be understood that the multiplication module 478 can be used in the above-described third sequencing embodiment.

An amplifier 480 can receive the differential combined sequential signal 478a, 478b and can generate an amplified signal 480a. A band pass filter 482 can received the amplified signal 480a and can generate a filtered signal 482a. The filtered signal 482a can be similar to the ideal signal 204 of FIG. 2, but at double the frequency.

A comparator 484 can receive the filtered signal 482a, receive a DC threshold signal 486, and can generate a two-state comparison signal 484a.

An angle calculation module 488 can receive the comparison signal 484a, can receive clock signals 496b, 496c, and can identify a relative phase of the comparison signal 484a, relative to one of the clock signals 496b, 496c. It should be understood that the relative phase is related to an angle of a sensed magnetic field in a plane of the first and second CVH elements 402, 430 generated by a magnet, for example, the circular magnet 440 coupled to a shaft 442 and operable to rotate.

The angle calculation module 488 can generate an angle signal 488a comprising information about the angle of the sensed magnetic field. In some embodiments, the angle signal 488a can have a digital count value related to the sensed angle of the magnetic field.

The rotation speed module 420 can be coupled to receive the angle signal 488a and can be operable to generate the speed signal 420a indicative of the speed of movement, e.g., the speed of rotation, of a magnetic field as may be generated by the rotating magnet 440.

The rotation direction module 422 can be coupled to receive the angle signal 488a and can be operable to generate the direction signal 422a indicative of a direction of movement, e.g., a direction of rotation, of a magnetic field as may be generated by the rotating magnet 440.

An output format module 490 can receive one or more of the angle signal 488a, the speed signal 420a, or the direction signal 422a, and can generate an output signal 490a having one or more of angle information, speed information, or direction information.

In an alternate embodiment, the multiplication module 478 can be replaced by a summing module 494 or a differencing module 496 in accordance with the above described first or second sequencing embodiments.

While the magnetic field sensors 400, 450, and 470 are shown to include first and second CVH elements 402, 430, it should be apparent that the magnetic field sensors can include more than two CVH elements that are combined in similar ways to generate one output signal.

In other embodiments, the first and second CVH elements 402, 430 can be replaced by separate magnetic field sensing elements arranged, for example, in respective circles comparable to the plurality of magnetic field sensing elements of FIG. 1A.

All references cited herein are hereby incorporated herein by reference in their entirety.

Having described preferred embodiments, which serve to illustrate various concepts, structures and techniques, which are the subject of this patent, it will now become apparent that other embodiments incorporating these concepts, structures and techniques may be used. Accordingly, it is submitted that the scope of the patent should not be limited to the described embodiments but rather should be limited only by the spirit and scope of the following claims.

Elements of embodiments described herein may be combined to form other embodiments not specifically set forth above. Various elements, which are described in the context of a single embodiment, may also be provided separately or in any suitable subcombination. Other embodiments not specifically described herein are also within the scope of the following claims.

What is claimed is:

1. A magnetic field sensor for sensing a direction of a magnetic field in an x-y plane, the magnetic field sensor comprising:
a first plurality of magnetic field sensing elements operable to generate a first plurality of magnetic field signals, the first plurality of magnetic field sensing elements having a respective first plurality of maximum response axes aligned in a respective first plurality of different directions in the x-y plane;
a second plurality of magnetic field sensing elements operable to generate a second plurality of magnetic field signals different than the first plurality of magnetic field signals, the second plurality of magnetic field sensing elements having a respective second plurality of maximum response axes aligned in a respective second plurality of directions in the x-y plane, wherein the first plurality of directions and the second plurality of directions comprise the same plurality of directions or different pluralities of directions;
at least one sequence switches circuit operable to select ones of the first plurality of magnetic field signals and to select ones of the second plurality of magnetic field signals; and
a processing circuit operable to combine the selected ones of the first plurality of magnetic field signals and the selected ones of the second plurality of magnetic field signals to generate at least one sequential signal and to process the at least one sequential signal to generate an x-y angle signal indicative of a direction of the magnetic field in the x-y plane.

2. The magnetic field sensor of claim 1, wherein the selected ones of the first plurality of magnetic field signals comprises a first sequential signal and the selected ones of the second plurality of magnetic field signals comprises a second sequential signal different than the first sequential signal, and wherein the processing circuit comprises a summing node or differencing node coupled to receive a first signal representative of the first sequential signal, coupled to receive a second signal representative of the second sequential signal, and configured to generate a combined sequential signal as a sum or a difference of the first signal and the second signal.

3. The magnetic field sensor of claim 1, wherein the selected ones of the first plurality of magnetic field signals comprises a first sequential signal and the selected ones of the second plurality of magnetic field signals comprises a second sequential signal different than the first sequential signal, and wherein the processing circuit comprises a multiplication node coupled to receive a first signal representative of the first sequential signal, coupled to receive a second signal representative of the second sequential signal, and configured to generate a combined sequential signal as a product of the first signal and the second signal.

4. The magnetic field sensor of claim 3, wherein the processing circuit further comprises a filter coupled to the multiplication node and operable to remove higher harmonics within the combined sequential signal.

5. The magnetic field sensor of claim 1, wherein the first plurality of magnetic field sensing elements is angularly aligned in the x-y plane with the second plurality of magnetic field sensing elements.

6. The magnetic field sensor of claim 5, wherein the first plurality of magnetic field sensing elements comprises a first CVH element, wherein the second plurality of magnetic field sensing elements comprises a second CVH element different than the first CVH element, and wherein the angular alignment corresponds to an alignment in the x-y plane between contacts of the first and the second CVH elements.

7. The magnetic field sensor of claim 1, wherein the first plurality of magnetic field sensing elements is angularly misaligned in the x-y plane by a predetermined misalignment angle from the second plurality of magnetic field sensing elements.

8. The magnetic field sensor of claim 7, wherein the first plurality of magnetic field sensing elements comprises a first CVH element, wherein the second plurality of magnetic field sensing elements comprises a second CVH element different than the first CVH element, and wherein the predetermined misalignment angle corresponds to an angle in the x-y plane between a contact of the first CVH element and a contact of the second CVH element being half of an angle between adjacent contacts of the first CVH element.

9. The magnetic field sensor of claim 1, wherein the first plurality of magnetic field sensing elements comprises a first CVH element, and wherein the second plurality of magnetic field sensing elements comprises a second CVH element different than the first CVH element.

10. The magnetic field sensor of claim 1, wherein the at least one sequential signal consists of one combined sequential signal comprising alternating selected sequential ones of the first plurality of magnetic field signals and the second plurality of magnetic field signals.

11. The magnetic field sensor of claim 10, wherein adjacent ones in time of the sequentially selected ones of the first plurality of magnetic fields signals and the sequentially selected ones of the second plurality of magnetic field signals are derived from magnetic field sensing elements within the first plurality of magnetic field sensing elements and magnetic field sensing elements within the second plurality of magnetic field sensing elements that are angularly aligned in the x-y plane.

12. The magnetic field sensor of claim 11, wherein the first plurality of magnetic field sensing elements comprises a first CVH element, wherein the second plurality of magnetic field sensing elements comprises a second CVH element different than the first CVH element, and wherein the angular alignment comprises an alignment in the x-y plane between contacts of the first and the second CVH elements.

13. The magnetic field sensor of claim 10, wherein adjacent ones in time of the sequentially selected ones of the first plurality of magnetic fields signals and the sequentially selected ones of the second plurality of magnetic field signals are derived from magnetic field sensing elements within the first plurality of magnetic field sensing elements and magnetic field sensing elements within the second plurality of magnetic field sensing elements that are angularly separated in the x-y plane by a predetermined angular separation angle.

14. The magnetic field sensor of claim 13, wherein the first plurality of magnetic field sensing elements comprises a first CVH element, wherein the second plurality of magnetic field sensing elements comprises a second CVH element different than the first CVH element, and wherein the angular separation angle corresponds to an angle in the x-y plane of about ninety degrees.

15. The magnetic field sensor of claim 13, wherein the first plurality of magnetic field sensing elements comprises a first CVH element, wherein the second plurality of magnetic field sensing elements comprises a second CVH element different than the first CVH element, and wherein the angular separation angle corresponds to an angle in the x-y plane of about one hundred eighty degrees.

16. The magnetic field sensor of claim 13, wherein the first plurality of magnetic field sensing elements comprises a first CVH element, wherein the second plurality of magnetic field sensing elements comprises a second CVH element different than the first CVH element, and wherein the angular separation angle corresponds to angle in the x-y plane between a contact of the first CVH element and a contact of the second CVH element being half of an angle between adjacent contacts of the first CVH element.

17. The magnetic field sensor of claim 1, wherein the at least one sequential signal comprises a first sequential signal and a second sequential signal different than the first sequential signal, the first sequential signal comprising sequentially selected ones of the first plurality of magnetic field signals, and the second sequential signal comprising sequentially selected ones of the second plurality of magnetic field signals.

18. The magnetic field sensor of claim 17, wherein adjacent ones in time of the sequentially selected ones of the first plurality of magnetic fields signals and the sequentially selected ones of the second plurality of magnetic field signals are derived from magnetic field sensing elements within the first plurality of magnetic field sensing elements and magnetic field sensing elements within the second plurality of magnetic field sensing elements that are angularly aligned in the x-y plane.

19. The magnetic field sensor of claim 18, wherein the first plurality of magnetic field sensing elements comprises a first CVH element, wherein the second plurality of magnetic field sensing elements comprises a second CVH element different than the first CVH element, and wherein the angular alignment comprises an alignment in the x-y plane between a contact of the first CVH element and a contact of the second CVH element.

20. The magnetic field sensor of claim 17, wherein adjacent ones in time of the sequentially selected ones of the first plurality of magnetic fields signals and the sequentially selected ones of the second plurality of magnetic field signals are derived from magnetic field sensing elements within the first plurality of magnetic field sensing elements and magnetic field sensing elements within the second plurality of magnetic field sensing elements that are angularly separated in the x-y plane by a predetermined angular separation angle.

21. The magnetic field sensor of claim 20, wherein the first plurality of magnetic field sensing elements comprises a first CVH element, wherein the second plurality of magnetic field sensing elements comprises a second CVH element different than the first CVH element, and wherein the angular separation angle corresponds to an angle in the x-y plane of about ninety degrees.

22. The magnetic field sensor of claim 20, wherein the first plurality of magnetic field sensing elements comprises a first CVH element, wherein the second plurality of magnetic field sensing elements comprises a second CVH element different than the first CVH element, and wherein the angular separation angle corresponds to an angle in the x-y plane of about one hundred eighty degrees.

23. The magnetic field sensor of claim 20, wherein the first plurality of magnetic field sensing elements comprises a first CVH element, wherein the second plurality of magnetic field sensing elements comprises a second CVH element different than the first CVH element, and wherein the angular separation angle corresponds to angle in the x-y plane between a contact of the first CVH element and a contact of the second CVH element being half of an angle between adjacent contacts of the first CVH element.

24. The magnetic field sensor of claim 1, wherein the first plurality of magnetic field sensing elements comprises a first CVH element, wherein the second plurality of magnetic field sensing elements comprises a second CVH element different than the first CVH element, and wherein the processing circuit is operable to combine the selected ones of the first plurality of magnetic field signals and the selected ones of the second plurality of magnetic field signals in a differential arrangement.

25. A method of sensing a direction of a magnetic field in an x-y plane, the method comprising:
generating a first plurality of magnetic field signals with a first plurality of magnetic field sensing elements, the first plurality of magnetic field sensing elements having a respective first plurality of maximum response axes aligned in a respective first plurality of different directions in the x-y plane;
generating a second plurality of magnetic field signals different than the first plurality of magnetic field signals with a second plurality of magnetic field sensing elements, the second plurality of magnetic field sensing elements having a respective second plurality of maximum response axes aligned in a respective second plurality of directions in the x-y plane, wherein the first plurality of directions and the second plurality of directions comprise the same plurality of directions or different pluralities of directions;
selecting ones of the first plurality of magnetic field signals and selecting ones of the second plurality of magnetic field signals;
processing the selected ones of the first plurality of magnetic field signals and the selected ones of the second plurality of magnetic field signals to generate at least one sequential signal; and
processing the at least one sequential signal to generate an x-y angle signal indicative of a direction of the magnetic field in the x-y plane.

26. The method of claim 25, wherein the at least one sequential signal comprises a first sequential signal and a second sequential signal different than the first sequential signal, and wherein the processing comprises:
generating a combined sequential signal as a sum or a difference of a first signal representative of the first sequential signal and a second signal representative of the second sequential signal.

27. The method of claim 25, wherein the at least one sequential signal comprises a first sequential signal and a second sequential signal different than the first sequential signal, and wherein the processing comprises:
generating a combined sequential signal as a product of a first signal representative of the first sequential signal and a second signal representative of the second sequential signal.

28. The method of claim 25, wherein the first plurality of magnetic field sensing elements comprises a first CVH element, wherein the second plurality of magnetic field sensing elements comprises a second CVH element different than the first CVH element.

* * * * *

UNITED STATES PATENT AND TRADEMARK OFFICE
CERTIFICATE OF CORRECTION

PATENT NO. : 10,386,427 B1
APPLICATION NO. : 15/892843
DATED : August 20, 2019
INVENTOR(S) : Andreas P. Friedrich et al.

It is certified that error appears in the above-identified patent and that said Letters Patent is hereby corrected as shown below:

In the Specification

Column 2, Line 42 delete "resolution.)" and replace with --resolution).--.

Column 2, Line 52 delete "resolution.)" and replace with --resolution).--.

Column 14, Line 20 delete "FIG. 3, 3A, 3B" and replace with --FIGS. 3, 3A, 3B--.

Column 16, Line 45 delete "can received" and replace with --can receive--.

Column 18, Line 1 delete "can received" and replace with --can receive--.

Signed and Sealed this
Seventh Day of April, 2020

Andrei Iancu
*Director of the United States Patent and Trademark Office*